United States Patent
May

(10) Patent No.: US 7,199,739 B2
(45) Date of Patent: Apr. 3, 2007

(54) PROGRAMMABLE SAMPLE RATE ANALOG TO DIGITAL CONVERTER AND METHOD FOR USE THEREWITH

(75) Inventor: Michael R. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 11/152,910

(22) Filed: Jun. 15, 2005

(65) Prior Publication Data

US 2006/0284749 A1   Dec. 21, 2006

(51) Int. Cl.
*H03M 3/00* (2006.01)
(52) U.S. Cl. .................................... 341/143; 341/155
(58) Field of Classification Search ............... 341/143, 341/155; 455/63, 570, 553
See application file for complete search history.

(56) References Cited

U.S. PATENT DOCUMENTS

| | | | | |
|---|---|---|---|---|
| 5,113,189 A | * | 5/1992 | Messer et al. ............... | 341/143 |
| 5,157,395 A | * | 10/1992 | Del Signore et al. ........ | 341/143 |
| 5,233,542 A | * | 8/1993 | Hohner et al. ............... | 702/199 |
| 5,590,065 A | * | 12/1996 | Lin ............................. | 708/313 |
| 5,952,947 A | * | 9/1999 | Nussbaum et al. .......... | 341/143 |
| 6,356,603 B1 | * | 3/2002 | Martin et al. ................ | 375/345 |
| 6,788,236 B2 | * | 9/2004 | Erdogan et al. ............. | 341/155 |
| 6,822,692 B2 | * | 11/2004 | Menkhoff .................... | 348/537 |
| 6,970,717 B2 | * | 11/2005 | Behrens et al. ........... | 455/553.1 |
| 2004/0021595 A1 | * | 2/2004 | Erdogan et al. ............. | 341/144 |

* cited by examiner

*Primary Examiner*—Peguy JeanPierre
(74) *Attorney, Agent, or Firm*—Garlick Harrison & Markison; Bruce E. Stuckman

(57) ABSTRACT

A programmable sample rate ADC includes a delta sigma modulator for producing a digital signal, and a programmable decimation filter, that includes X stages of integration, a down-sampling stage for down-sampling by a factor of N, and Y stages of differentiation. The programmable sample rate ADC produces a digital output signal at a substantially constant frequency.

26 Claims, 8 Drawing Sheets

PROGRAMMABLE SAMPLE RATE ANALOG TO DIGITAL CONVERTER AND METHOD FOR USE THEREWITH

CROSS REFERENCE TO RELATED PATENTS

The present application is related to the following commonly assigned patent application, CONTROLLABLE PHASE LOCKED LOOP AND METHOD FOR PRODUCING AN OUTPUT OSCILLATION FOR USE THEREWITH, the disclosure of which is hereby incorporated by reference thereto.

TECHNICAL FIELD OF THE INVENTION

The present invention relates to analog to digital converters used in devices such as radio receivers, and related methods.

DESCRIPTION OF RELATED ART

Radio receivers typically include one or more local oscillators for down converting selected radio channels from their carrier frequency to either an intermediate frequency or to baseband. Receivers that operate with digital circuitry typically operate using clock signals. The presence of multiple local oscillator signals and clock signals in a single design can produce undesirable noise signals at the sum and difference of these signals and at their respective harmonics. To eliminate some of these mix products that limit receiver performance, near zero intermediate frequency architectures are often used. These architectures adjust the local oscillator clock to be at a frequency that is nearly equal to the received signal center frequency. After conversion to a digital waveform, the data stream needs to be converted to a constant rate stream so the digital signal processing can perform further filtering on the waveforms. This digital signal processing is efficiently implemented if the sample rate of the digital input signal is constant, which allows for fixed filter coefficients.

The need exists for a low noise radio receiver that can be implemented efficiently on an integrated circuit.

DETAILED DESCRIPTION OF THE INVENTION INCLUDING THE PRESENTLY PREFERRED EMBODIMENTS

The embodiments of the present invention yield several advantages over the prior art. The present invention details an implementation for an efficient architecture for converting variable rate digital signals to a roughly constant rate. This sample rate conversion is not exact in all cases, but it gives a very acceptable tradeoff between complexity and performance, and allows efficient digital filtering of a variable rate received signal.

A receiver front end is presented that includes an analog front end that has a sample rate that is a function of the desired channel to be down converted. The sampled signal has a variable center frequency and is converted to a digital signal through an analog to digital converter. Further processing of the signal is needed in the digital domain. This digital signal processing is most efficiently implemented if the filter coefficients can be constant. Filter coefficients can be constant if the sample rate of the incoming data stream is constant, or nearly constant so that the variations in filter performance are negligible. The filter coefficients could be programmed to perform different filtering functions based on desired performance adjustments, but the filter would not vary based solely on channel frequency.

Figure 1:
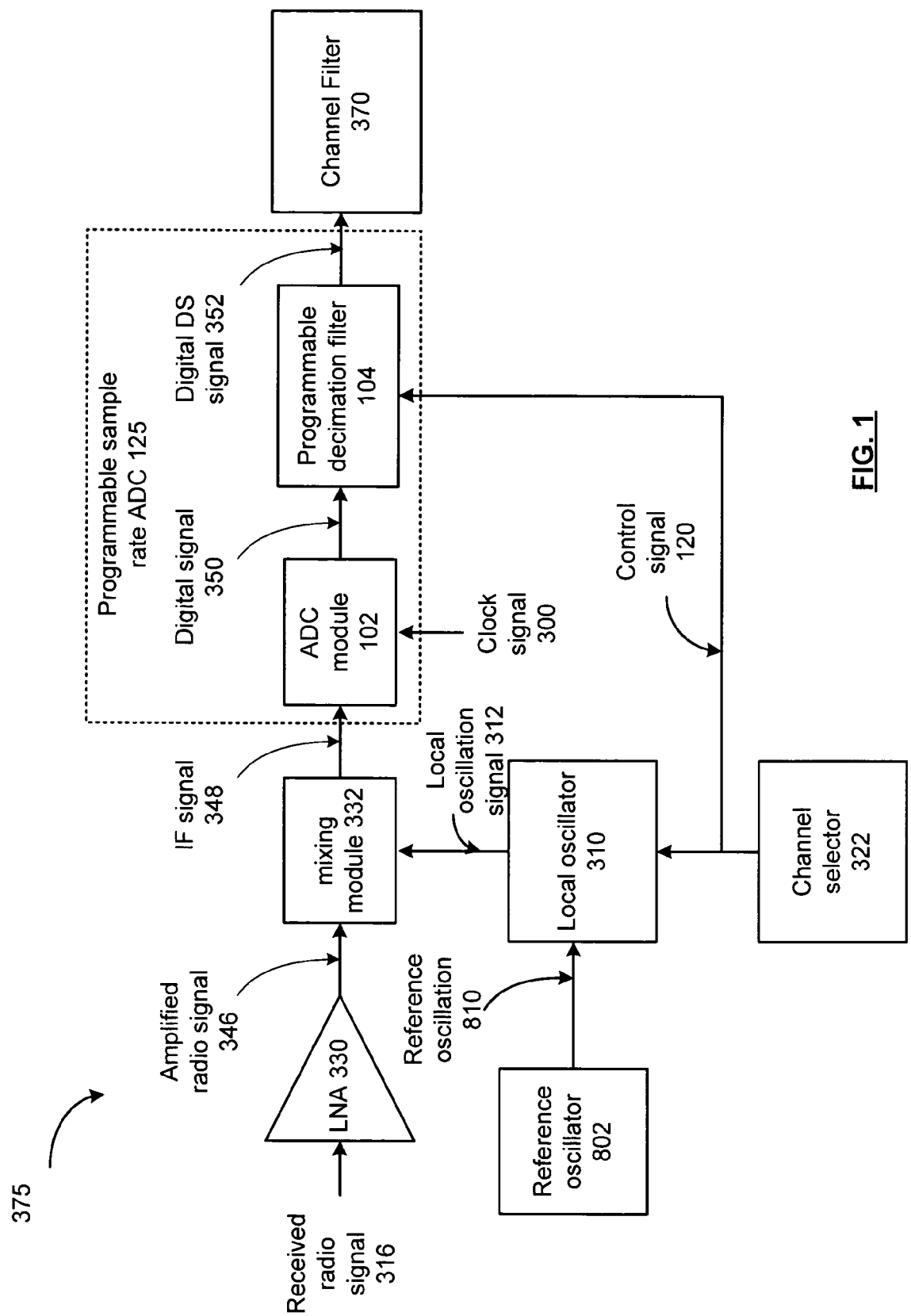
FIG. 1 presents a combination block diagram and schematic diagram of a radio receiver front end in accordance with an embodiment of the present invention.

FIG. 1 presents a combination block diagram and schematic diagram of a radio receiver front end in accordance with an embodiment of the present invention. In particular, the programmable sample rate ADC described is utilized in a radio receiver front end 375 to convert an intermediate frequency (IF) signal into a digital downsampled signal. Radio receiver front end 375 receives a received radio signal 316 having a plurality of channel signals, each of the plurality of channel signals being modulated at one of a corresponding plurality of carrier frequencies. Reference oscillator 802 produces a reference oscillation 810 that is transformed by local oscillator 310 into a local oscillation signal 312 at a local oscillation frequency. A channel selector 322 produces control signal 120 that selects the local oscillation frequency for local oscillator 310 corresponding to a selection of one of the plurality of channels. In an embodiment of the present invention, local oscillator 310 includes a phase locked loop circuit for producing a selected local oscillation frequency based on the selected one of the plurality of channels.

Low noise amplifier 330 produces a amplified radio signal 346 that is mixed with the local oscillation signal 312 by mixing module 332 to form IF signal 348 at an intermediate frequency. In a preferred embodiment of the present invention, the gain at which the low noise amplifier 330 amplifies the receive signal 316 is dependent on the magnitude of the received radio signal 316 and an automatic gain control circuit. Note that IF signal 348 is a modulated signal and if the local oscillation signal 312 has a frequency that matches the frequency of the selected channel, the IF signal 348 will have a carrier frequency of approximately zero. If the local oscillation 312 has a frequency that is not equal to the carrier frequency of radio signal 346, then the IF signal 348 will have a carrier frequency based on the difference between the carrier frequency of the selected channel and the frequency of local oscillation 312. In such a situation, the carrier frequency of the IF signal 348 may range from 0 hertz to one megahertz or more.

Programmable sample rate ADC 125 includes, in an embodiment of the present invention, an analog to digital converter (ADC) module 102 that converts the IF signal 348 into a digital signal 350, based on clock signal 300. As noted above, digital signal 350 may or may not be down-converted to baseband. Programmable sample rate ADC 125 further includes programmable decimation filter 104 for converting the digital signal 350 into a digital downsampled (DS) signal 352, in response to control signal 120. Clocking signal 300 is a variable frequency clock and may be a function of control signal 120 or local oscillation signal 312. As clocking signal 300 is adjusted to convert analog data to digital data at various rates, decimation module 104 will be adjusted to produce digital downsampled signal 352 at a roughly constant output rate.

Consider the operation of the radio receiver front end 375 in light of the following example. In this example, received radio signal 316 is a frequency modulated (FM) broadcast signal that includes a plurality of channels that are spaced 200 kHz apart in the range of 88 MHz to 108 MHz. Consider further a selected channel to be received that operates at a carrier frequency of 100 MHz. Channel selector 322 generates a control signal 120 that includes a 7 bit signal that commands local oscillator 310 to produce a 100 MHz local oscillation signal 312 from reference oscillation 810.

Low noise amplifier 330 amplifies and passes the entire 88 MHz–108 MHz broadcast band as amplified radio signal 346. Mixing module 332 down converts the amplified radio signal 346 by 100 MHz, and filters the output to produce a baseband IF signal 348 having a 200 kHz bandwidth, corresponding to the broadcast FM channel whose carrier frequency was 100.1 MHz. ADC module 102 converts the IF signal 348 into a digital signal 350 based on a clock signal having a frequency of 50.05 MHz, that is formed by dividing the local oscillator signal by a factor D=2.

Control signal 120 further includes a 4 bit signal that selects N=40, corresponding to 40-times down sampling in programmable decimation filter 104. In further examples, corresponding to the selection of other FM broadcast channels, higher frequency channels require higher local oscillator frequencies and correspondingly higher frequencies for clock signal 300, and higher selected down sampling factors N for programmable decimation filter 104 in order to provide a digital downsampled signal 352 having a sample frequency that is substantially constant, roughly independent from the selected channel and from the resulting clock signal frequency. Selection of a FM channel of in the range of say 99.1–101.1 MHz could like use down sampling factor N=40, however, selection of channel frequency of 102.1 MHz could use a down sampling factor N=41, in order to control the sample frequency of digital downsampled signal 352 to a relatively constant range. In this example, digitally downsampled signal 352 will be constant with approximately a 2% tolerance.

The use of a 4-bits of control signal to select the value of N, allows for 16 different values. In a preferred embodiment of the present invention, N ranges from 35 to 45. In alternative embodiments of the present invention, an arbitrary range of N could likewise be used with a corresponding number of bits as will be understood by one skilled in the art, based on the teachings presented herein.

In an embodiment of the present invention, digital downsampled signal 352 provides the input to a filter, such as channel filter 370, that has at least one coefficient that is independent from the control signal 120. Selecting the down sampling factor N of programmable decimation filter 104 to provide a relatively constant sample frequency, allows the coefficients of channel filter 370 to be selected, independent from the variable frequency clock signal 300 and thus, independent of control signal 120 and the channel selected by channel selector 322.

In a preferred embodiment of the present invention, the IF signal 348 includes an in-phase IF signal and a quadrature-phase IF signal. The digital signal 350 includes an in-phase digital signal and a quadrature-phase digital signal and the digital downsampled signal 352 includes an in-phase digital downsampled signal and a quadrature-phase digital downsampled signal. In accordance with this embodiment, the ADC module 102 includes a first ADC submodule for processing the in-phase component of the IF signal 348 into the in-phase digital signal 350 and a second ADC submodule for processing the quadrature-phase component of the IF signal 348 into the quadrature-phase digital signal 350. Further, the programmable decimation filter 104 includes a first programmable decimation filter submodule for processing the in-phase component of the digital signal 350 into the in-phase digital downsampled signal 352 and a second programmable decimation filter submodule for processing the quadrature-phase component of the digital signal 350 into the quadrature-phase digital downsampled signal 352. Further, channel filter 370 includes a first channel filter submodule for processing the in-phase component of digital downsampled signal 352, and a second channel filter submodule for processing the quadrature-phase component of digital downsampled signal 352. In other embodiments, there may be a digital mixing module before or after the channel filter 370, if the digital downsampled signal 352 is not sufficiently close to a carrier frequency of 0 Hz. This mixing module would act to move the center frequency of the desired radio signal to substantially 0 Hz.

Figure 2:
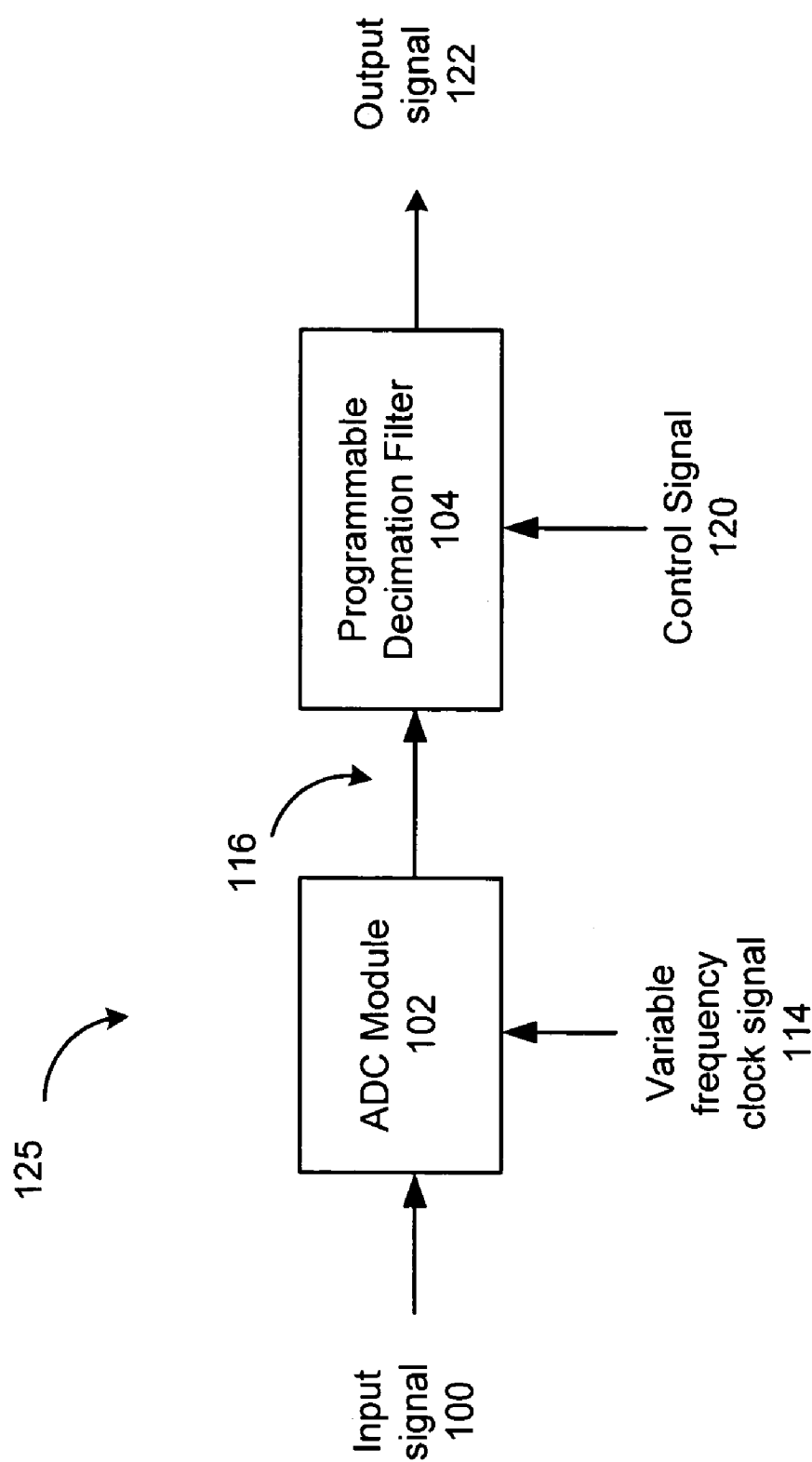
FIG. 2 presents a block diagram representation of a programmable sample rate ADC in accordance with an embodiment of the present invention.

FIG. 2 presents a block diagram representation of a programmable sample rate ADC in accordance with an embodiment of the present invention. In particular, a programmable sample rate ADC 125 is presented that produces an output signal 122 in response to an input signal 100, such as IF signal 348. Analog to digital converter (ADC) module 102 is operatively coupled to the input signal 100 and a variable frequency clock signal 114, such as clock signal 300 for producing a digital signal 116, such as digital signal 350. In an embodiment of the present invention, variable frequency clock signal 114 has a clock frequency that is based on a control signal 120. A programmable decimation filter 104, operatively coupled to the digital signal 116 and the control signal 120, produces the output signal 122, such as digital downsampled signal 352, wherein the frequency of the output signal is substantially constant, relatively independent from the variation in the clock signal 114.

Figure 3:
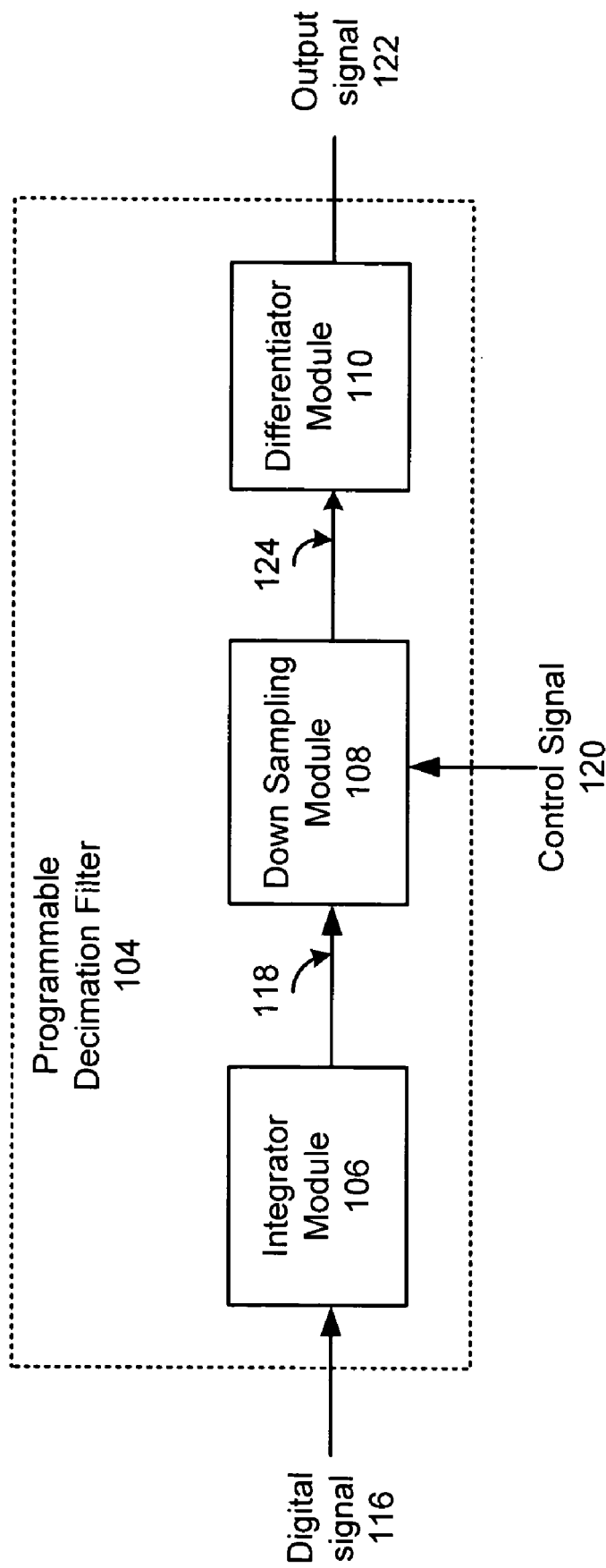
FIG. 3 presents a block diagram representation of a programmable decimation filter in accordance with a further embodiment of the present invention.

FIG. 3 presents a block diagram representation of a programmable decimation filter in accordance with a further embodiment of the present invention. In this embodiment, programmable decimation filter 104 includes an integrator module 106 that integrates the digital signal 116 to produce an integrated signal 118. Down sampling module 108 down samples the integrated signal 118 by a factor of N to produce a down-sampled signal 124, in response to a control signal 120. In a preferred embodiment, the down sampling factor N is selected based on control signal 120 so as to provide a substantially constant output frequency. Down-sampled signal 124 is differentiated by differentiator module 110 to produce output signal 122. In a preferred embodiment of the present invention, N is an integer value and control signal 120 is a digital signal that includes at least $\log_2(N)$ bits.

In an embodiment of the present invention, integration module 106 is implemented in digital circuitry and provides X stages of integration of digital signal 116. In terms of a Z-transform representation, the digital transfer function of integration module 106 is given by $(1/(1-Z^{-1}))^X$. Integration module 106 attenuates the high-frequency components of digital signal 116 and serves to provide anti-aliasing filtration, prior to the down-sampling operation of programmable decimation filter 104. In an embodiment of the present invention, differentiator module 110 is implemented in digital circuitry and provides Y stages of integration of down-sampled signal 124. Differentiator module 110 provides frequency correction to the down-sampled signal 124. In terms of a Z-transform representation, the digital transfer function of differentiator module 110 is given by $(1-Z^{-N})^Y$. In a preferred embodiment of the present invention the number of stages of integration matches the number of stages of differentiation, therefore X=Y. In alternative embodiments of the present invention, different types of digital decimation filters could be used. Other embodiments include infinite impulse response (IIR) filters, half band filters, finite impulse response (FIR) filters, and Butterworth filters.

Figure 4:
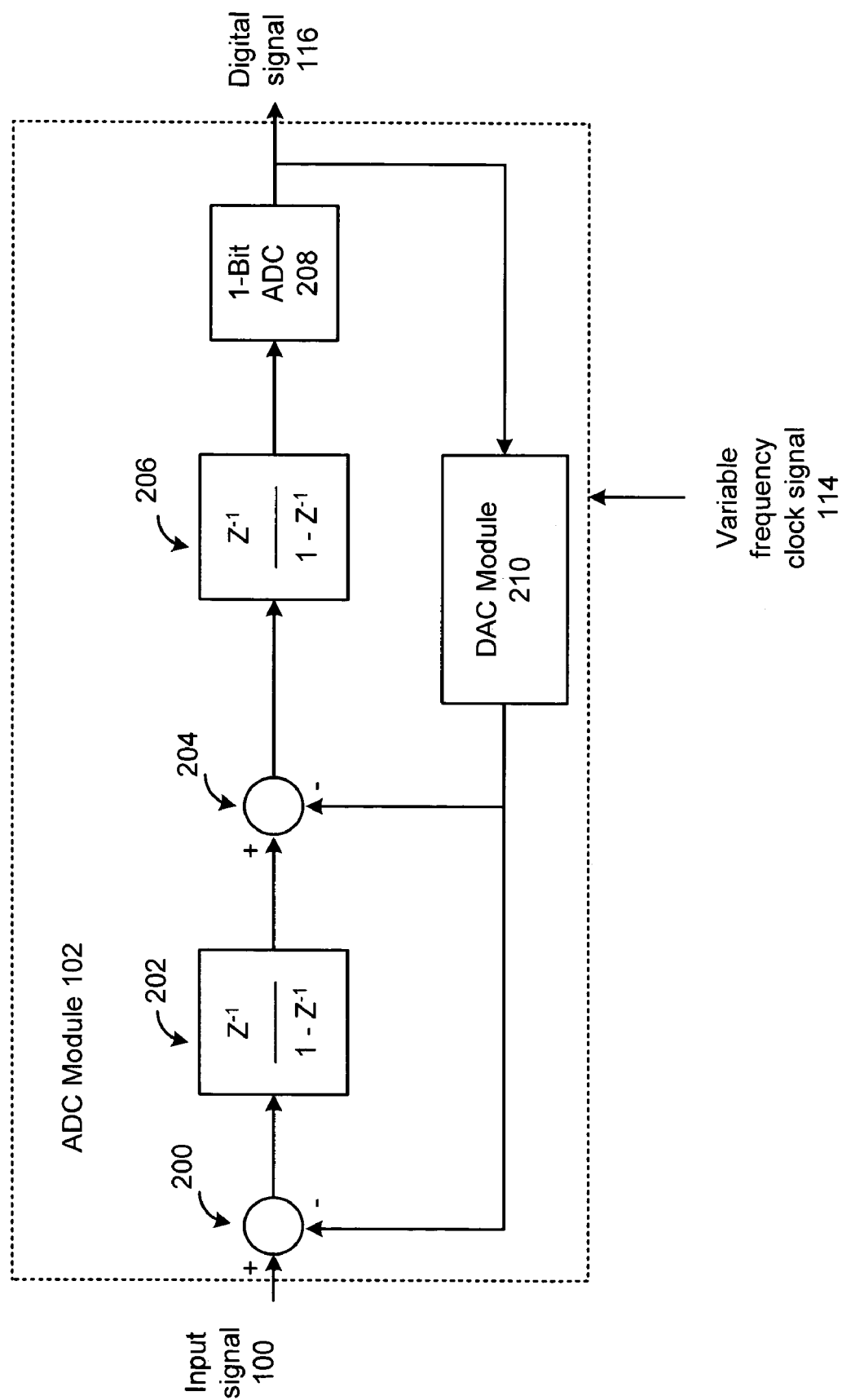
FIG. 4 presents a combination block diagram and schematic diagram of an ADC module in accordance with an embodiment of the present invention.

FIG. 4 presents a combination block diagram and schematic diagram of an ADC module in accordance with an embodiment of the present invention. In particular, ADC module 102 is implemented using a delta sigma modulator. Input signal 100 is fed to the noninverting input of a first adder 200. First adder generates an output signal that is the difference between input signal 100 and a reconstructed analog version of digital signal 116 produced by digital to analog converter (DAC) module 210. The output of the first adder is integrated by first integrator 202 to produce a first integrated output that is provided to the non-inverting input of a second adder 204. Second adder 204 produces an output that is the difference between the first integrated output and a reconstructed analog version of digital signal 116 produced by DAC module 210. The output of second adder 204 is integrated by a second integrator 206 and digital signal 116 is produced by converting the output of the second integrator to a digital signal using a 1-bit analog ADC module 208.

In operation, the delta sigma converter operates at a relatively high variable clock frequency in order to oversample the input signal 100. This over-sampling spreads the quantization noise produced by the ADC module 102 over multiple frequency bins, many of which can be filtered by the programmable decimation filter that follows. The result is a high precision voltage measurement for accurate processing of input signal 100.

While ADC module 102 has been described in terms of a delta sigma modulator, other ADC configurations including delta modulators, flash converters and other analog to digital converter methods, with or without significant over-sampling, could likewise be used in alternative embodiments of the present invention.

Figure 5:
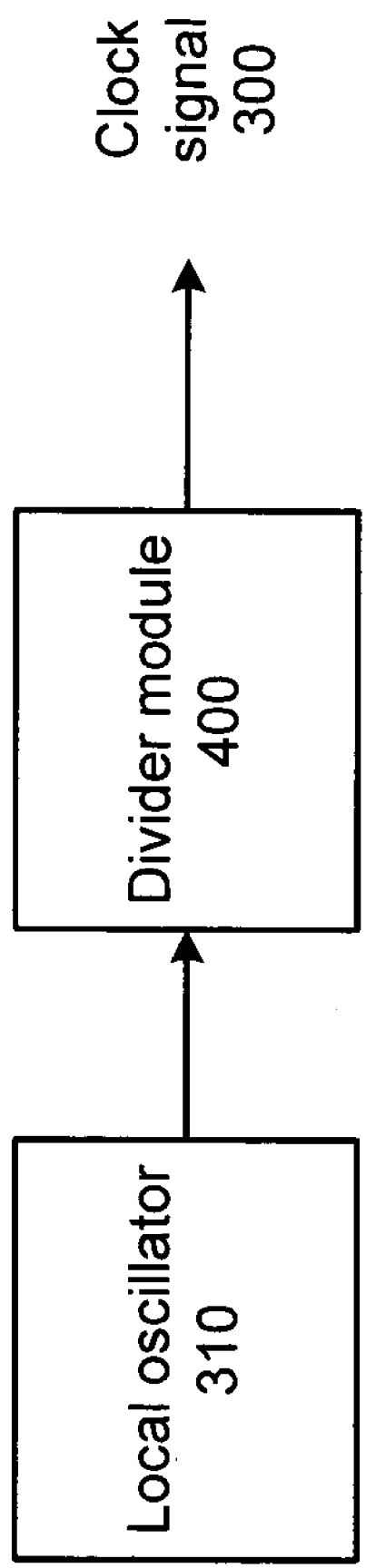
FIG. 5 presents a block diagram representation of the formation of a clock signal in accordance with an embodiment of the present invention.

FIG. 5 presents a block diagram representation of the formation of a clock signal in accordance with an embodiment of the present invention. In particular, clock signal 300 is formed by dividing the output of local oscillator 310 using divider module 400 that divides the frequency of local oscillator 310 by a factor, D. In an embodiment of the present invention, D is an integer value and divider module 400 employing shift registers, flip-flops and counters. In an alternative embodiment of the present invention, divider module 400 is implemented using a fractional divider that allows D to be a real number with both an integer and factional component, as will be evident to one of ordinary skill in the art based on the teachings disclosed herein. Also, a phase locked loop circuit could be used to multiply up by N, and divide by M, to achieve a ratio of integers to implement D.

With clock signal 300 being a divided version of local oscillator 310, noise spurs that would be created by the presence of two independent signals, are avoided. The expense of this configuration is that clock signal 300 varies, as the frequency of local oscillator 310 varies, with the selection of different radio channels. However, control signal 120 that controls the local oscillator 310 to tune the receiver front end to a particular channel, also commands the programmable decimation filter to select a down sampling factor N that substantially corrects for the variation in the frequency of clock signal 300, allowing channel filter 370 to employ coefficients that are independent from control signal 120, the frequency of clock signal 300 and the particular radio channel that is selected.

Figure 6:
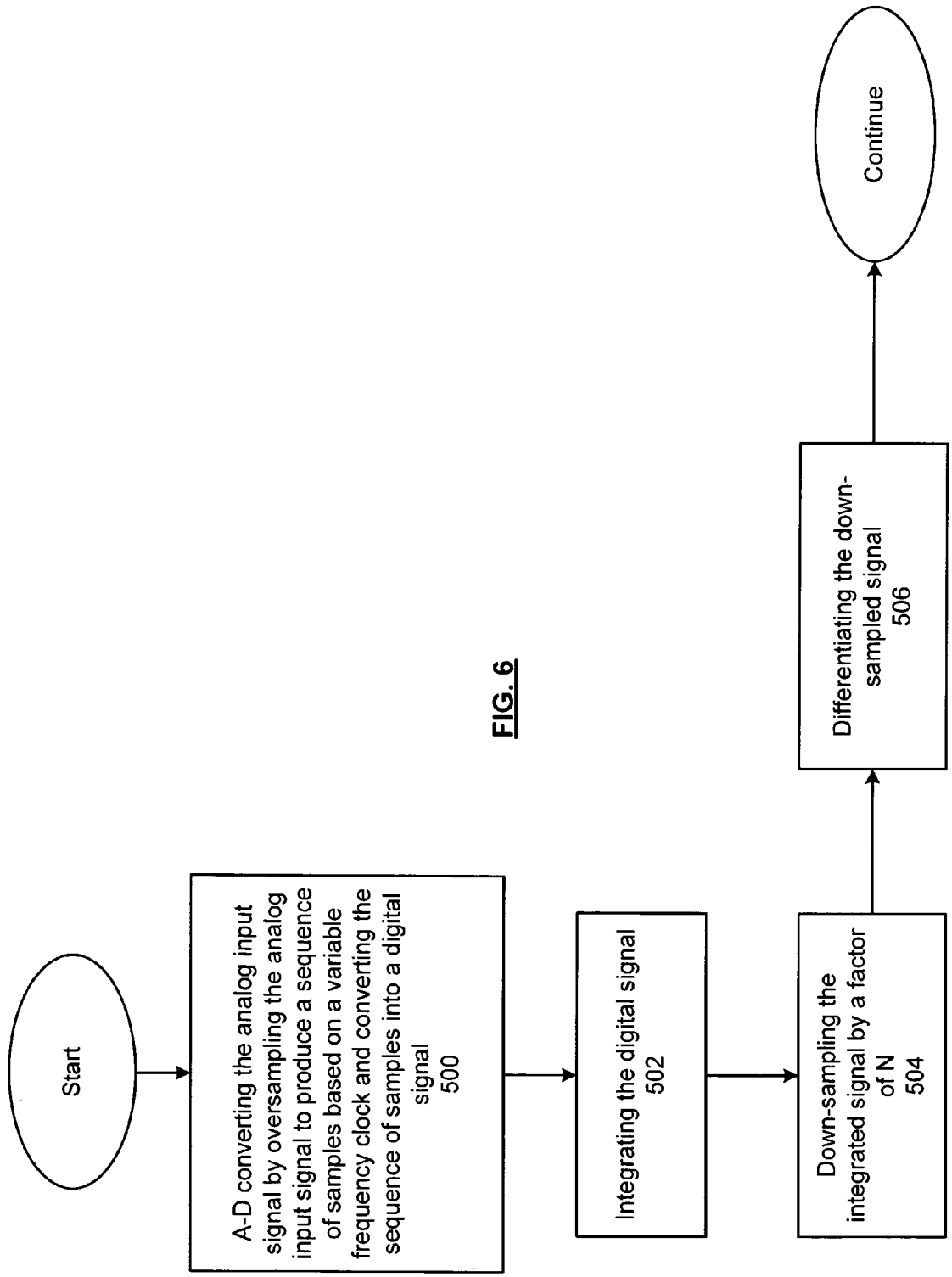
FIG. 6 presents a block diagram of a method in accordance with an embodiment of the present invention.

FIG. 6 presents a block diagram of a method in accordance with an embodiment of the present invention. In particular, a method is presented for converting an analog input signal into a digital output signal for use in conjunction with embodiments presented in FIGS. 1–5 and 7–8. The method begins in step 500 by analog to digital (A–D) converting the analog input signal into a digital signal. In an embodiment of the present invention, step 500 includes oversampling the analog input signal to produce a sequence of samples based on a variable frequency clock signal and further includes converting the sequence of samples into a digital signal. In step 502 the digital signal is integrated to produce an integrated signal. In step 504 the integrated signal is down sampled by a factor of N to produce a down-sampled signal. In step 506 the down-sampled signal is differentiated to produce a digital output signal.

In accordance with an embodiment of the present invention, the factor N is selected as a function of the control signal and wherein the variable frequency clock signal has a clock frequency that is based on the control signal. In a further embodiment, the down sampling factor N is selected based on a control signal so as to provide a substantially constant output sampling frequency. In an embodiment of the present invention, step 502 includes integrating the digital signal X times, wherein X is at least one, step 506 includes differentiating the down-sampled signal Y times, wherein Y is at least one, and X=Y. In an additional embodiment of the present invention, step 500 includes delta sigma modulating the analog input signal, using a delta sigma modulator such as the circuit disclosed in conjunction with FIG. 4.

Figure 7:
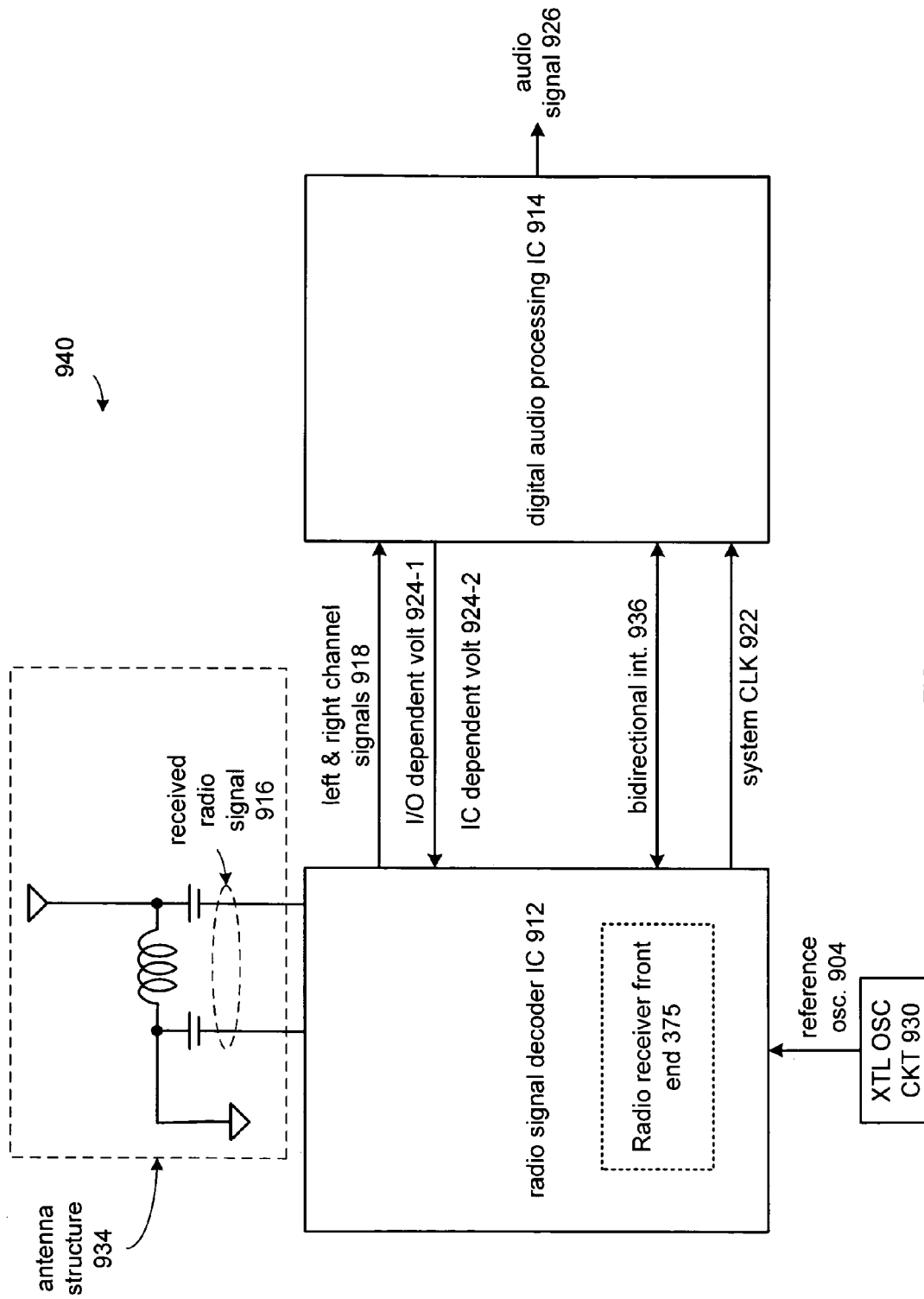
FIG. 7 presents a schematic block diagram of a handheld audio system in accordance with an embodiment of the present invention.

FIG. 7 presents a schematic block diagram of a handheld audio system in accordance with an embodiment of the present invention. In particular, handheld audio system 940 is presented that includes a radio signal decoder integrated circuit 912 that includes the radio receiver front end 375, programmable sample rate ADC 125, and/or corresponding method in accordance with FIGS. 1–6, and a digital audio processing integrated circuit 914. In this embodiment, the radio signal decoder integrated circuit 912 is operably coupled to a crystal oscillator circuit 930 and an antenna structure 934. The crystal oscillation circuit 930 is operably coupled to a crystal and produces therefrom a reference oscillation 904.

The antenna structure 934 includes an antenna, a plurality of capacitors and an inductor coupled as shown. The received radio signal 916 is provided from the antenna structure 934 to the radio signal decoder integrated circuit 912. The radio signal decoder integrated circuit 912 converts the received radio signal 916 into left and right channel signals 918.

The digital audio processing integrated circuit 914, via a DC-DC converter, generates an input/output (I/O) dependent supply voltage 924-1 and an integrated circuit (IC) dependent voltage 924-2 that are supplied to the radio signal decoder IC 912. In one embodiment, the I/O dependent voltage 924-1 is dependent on the supply voltage required for input/output interfacing of the radio signal decoder IC and/or the digital audio processing IC 914 (e.g., 3.3 volts) and the IC dependent voltage 924-2 is dependent on the IC process technology used to produce integrated circuits 912 and 914.

The interface between the integrated circuits 912 and 914 further includes a bi-directional interface 936. Such an interface may be a serial interface for the integrated circuits 912 and 914 to exchange control data and/or other type of data. In one embodiment, the bi-directional interface 936 may be one or more serial communication paths that are in accordance with the I²C serial transmission protocol. As one or ordinary skill in the art will appreciate, other serial transmission protocols may be used for the bi-directional interface 936 and the bi-directional interface 936 may include one or more serial transmission paths.

Figure 8:
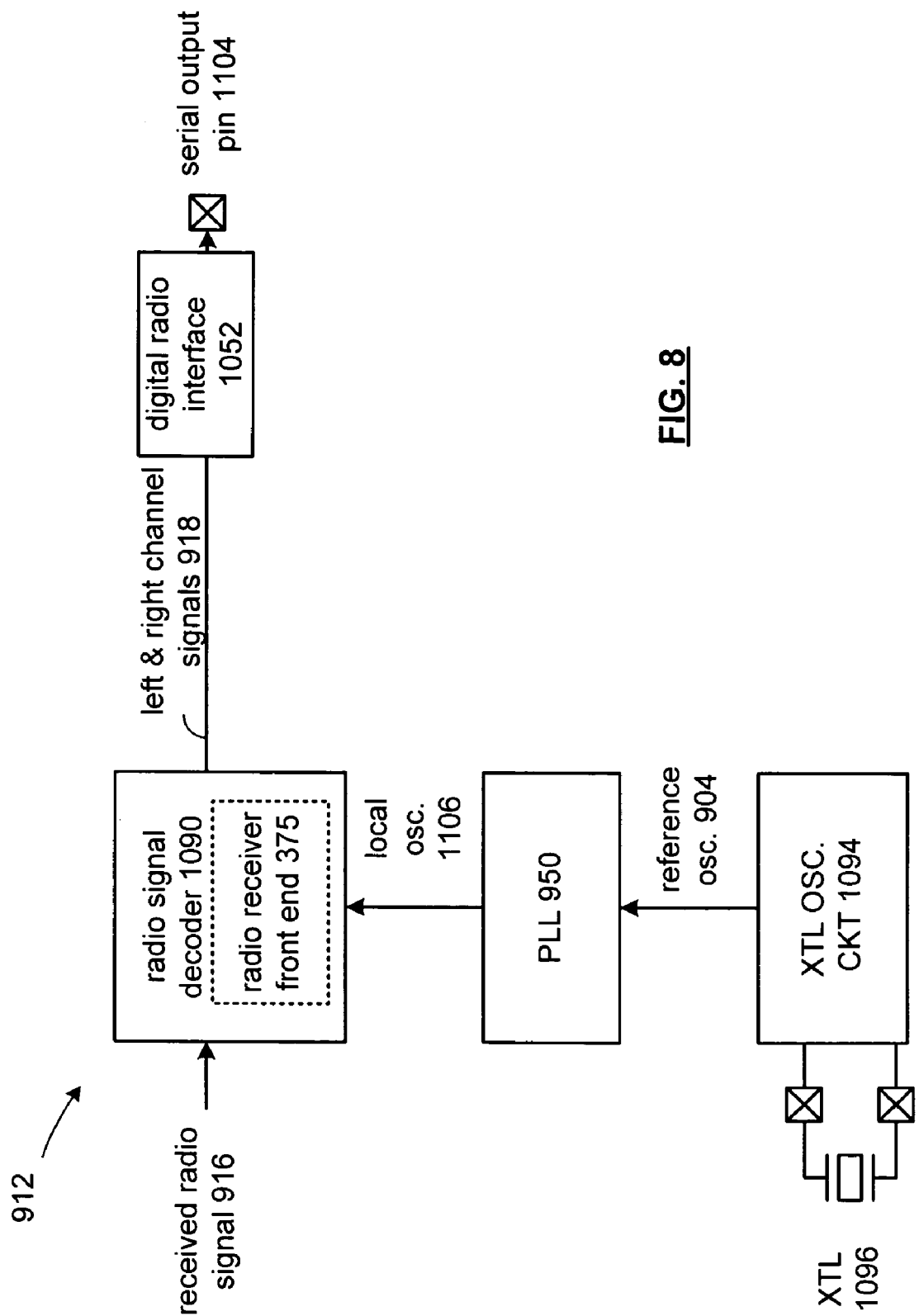
FIG. 8 presents a schematic block diagram of a radio signal decoder in accordance with an embodiment of the present invention.

FIG. 8 presents a schematic block diagram of a radio signal decoder in accordance with an embodiment of the present invention. In particular, an implementation of embodiment of the radio signal decoder integrated circuit 912 is presented that includes the digital radio interface 1052, a crystal oscillation circuit (XTL OSC CKT) 1094, a phase locked loop (PLL) 950 and a radio signal decoder 1090. Radio signal decoder 1090 includes the radio receiver front end 375, programmable sample rate ADC 125, and/or corresponding method in accordance with FIGS. 1–6. The crystal oscillation circuit 1094 is operably coupled, via integrated circuit pins, to an external crystal 1096 to produce a reference oscillation 904. The rate of the reference oscillation 904 is based on the properties of the external crystal 1096 and, as such, may range from a few kilo-Hertz to hundreds of mega-Hertz.

The phase locked loop 950 produces a local oscillation 1106 from the reference oscillation 904. The rate of the local oscillation corresponds to a difference between an intermediate frequency (IF) and a carrier frequency of the received radio signal 916. For instance, if the desired IF is 2 MHz and the carrier frequency of the received radio signal 916 is 101.5 MHz, the local oscillation is 99.5 MHz (i.e., 101.5 MHz–2 MHz). As one of ordinary skill in the art will appreciate, the intermediate frequency may range from DC to a few tens of MHz and the carrier frequency of the received radio signal 916 is dependent upon the particular type of radio signal (e.g., AM, FM, satellite, cable, etc.).

The radio signal decoder 1090 converts the received radio signal 916, which may be an AM radio signal, FM radio signal, satellite radio signal, cable radio signal, into the left and right channel signals 918 in accordance with the local oscillation 1106. The radio signal decoder 1090 provides the left and right channel signals to the digital radio interface 1052 for outputting via a serial output pin 1104. The serial output pin 1104 may include one or more serial input/output connections.

In preferred embodiments, the various circuit components are implemented using 0.08 to 0.35 micron CMOS technology. Provided however that other circuit technologies, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing an analog to digital converter and a radio receiver. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A programmable sample rate ADC, responsive to an input signal for producing an output signal having an output frequency, comprising:
    a delta sigma modulator operably coupled to produce a digital signal from an input signal in accordance with a variable frequency clock signal;
    a programmable decimation filter, operatively coupled to the digital signal and the control signal for producing the output signal, the programmable decimation filter including X stages of integration, a down-sampling stage for down-sampling by a factor of N, and Y stages of differentiation, wherein X is at least one, and wherein Y is at least one;
    wherein the factor N is controlled, to control the output frequency to be substantially constant.

2. The programmable sample rate ADC of claim 1 wherein the output signal is operably coupled to a filter, the filter having at least one filter coefficient that is selected independent from the control signal.

3. A programmable sample rate ADC, responsive to an input signal for producing an output signal having an output frequency, comprising:
    an analog to digital converter module, operatively coupled to the input signal and a variable frequency clock signal for producing a digital signal, the variable frequency clock signal having a clock frequency that is based on a control signal;
    a programmable decimation filter, operatively coupled to the digital signal and the control signal for producing the output signal, wherein the programmable decimation filter includes a down-sampling stage for down-sampling by a factor of N that is controlled, based on the control signal;
    wherein the output frequency is substantially constant.

4. The programmable sample rate ADC of claim 3 wherein the programmable decimation filter includes X stages of integration and wherein X is at least one.

5. The programmable sample rate ADC of claim 4 wherein the programmable decimation filter includes Y stages of differentiation and wherein X=Y.

6. The programmable sample rate ADC of claim 3 wherein the output signal is operably coupled to a filter, the filter having at least one filter coefficient that is selected independent from the control signal.

7. The programmable sample rate ADC of claim 6 wherein the analog to digital converter module includes a delta sigma modulator.

8. A method of converting an analog input signal into a digital output signal having an output sampling frequency that is substantially constant, the method comprising the steps of:
   A–D converting the analog input signal into a digital signal by oversampling the analog input signal to produce a sequence of samples based on a variable frequency clock signal and converting the sequence of samples into a digital signal;
   integrating the digital signal to produce an integrated signal;
   down-sampling the integrated signal by a factor of N to produce a down-sampled signal; and
   differentiating the down-sampled signal to produce the digital output signal;
   wherein, the factor N is selected based on a control signal so as to provide the substantially constant output sampling frequency.

9. The method of claim 8 wherein the variable frequency clock signal has a clock frequency that is based on the control signal.

10. The method of claim 8 wherein the step of integrating includes integrating the digital signal X-times, wherein X is at least one.

11. The method of claim 10 wherein step of differentiating includes differentiating the down-sampled signal Y times, wherein Y is at least one.

12. The method of claim 11 wherein X=Y.

13. The method of claim 8 wherein the step of A–D converting includes delta sigma modulating the analog input signal.

14. A radio receiver front end for receiving a received radio signal having a plurality of channel signals, each of the plurality of channel signals being modulated at one of a corresponding plurality of carrier frequencies, and for converting a selected one of the plurality of channel signals into a digital baseband signal, the radio receiver front end comprising:
   a channel selector, for producing a control signal that corresponds to a selected one of the plurality of channels;
   a local oscillator, operatively coupled to a reference oscillation, for producing a local oscillation signal at a local oscillation frequency, the local oscillation frequency based on the control signal;
   an analog to digital converter module, operatively coupled to a modulated signal, the modulated signal operably coupled to the receive radio signal, and a variable frequency clock signal for producing a digital signal; and
   a programmable decimation filter, operatively coupled to the digital signal and the control signal for producing the digital baseband signal, wherein the programmable decimation filter includes a down-sampling stage for down-sampling by a factor of N that is controlled, based on the control signal.

15. The radio receiver front end of claim 14 wherein the programmable decimation filter includes X stages of integration and wherein X is at least one.

16. The radio receiver front end of claim 15 wherein the programmable decimation filter includes Y stages of differentiation and wherein Y is at least one.

17. The radio receiver front end of claim 16 wherein X=Y.

18. The radio receiver front end of claim 14 wherein the analog to digital converter module includes a delta sigma modulator.

19. The radio receiver front end of claim 14 further comprising a channel filter, operably coupled to the digital baseband signal, the channel filter having at least one filter coefficient that is selected independent from the selected one of the plurality of channels.

20. The radio receiver front end of claim 19 wherein the variable frequency clock signal is operably coupled to the local oscillation signal.

21. The radio receiver front end of claim 19 further comprising a divider module for producing the variable frequency clock signal based on the local oscillation signal.

22. The radio receiver front end of claim 14 wherein the IF signal includes an in-phase modulated signal and a quadrature-phase modulated signal, the digital signal includes an in-phase digital signal and a quadrature-phase digital signal and wherein, and the digital baseband signal includes an in-phase digital baseband signal and a quadrature-phase digital baseband signal.

23. The radio receiver front end of claim 22 wherein the ADC module includes a first ADC submodule for processing the in-phase component of the modulated signal into the in-phase digital signal and a second ADC submodule for processing the quadrature-phase component of the modulated signal into the quadrature-phase digital signal.

24. The radio receiver front end of claim 23 wherein the programmable decimation filter includes a first programmable decimation filter submodule for processing the in-phase component of the digital signal into the in-phase component baseband signal and a second first programmable decimation filter submodule for processing the quadrature-phase component of the digital signal into the quadrature-phase digital baseband signal.

25. The radio receiver front end of claim 14 further comprising a reference oscillator for producing the reference oscillation.

26. The radio receiver front end of claim 14 further comprising:
   a low noise amplifier, operatively coupled to the received radio signal for producing an amplified radio signal; and
   a mixing module, for mixing the amplified radio signal and the local oscillation signal to form the modulated signal.

* * * * *